United States Patent [19]
Uytterhoeven et al.

[11] Patent Number: 5,340,693
[45] Date of Patent: Aug. 23, 1994

[54] HEAT-SENSITIVE RECORDING MATERIAL AND METHOD FOR OBTAINING AN IMAGE USING THE SAME

[75] Inventors: Herman Uytterhoeven, Bonheiden; Luc Bastiaens, Brasschaat; Rudolf Van den Bergh, Herenthout; Luc Leenders, Herentals, all of Belgium

[73] Assignee: Agfa-Gevaert, N.V., Mortsel, Belgium

[21] Appl. No.: 19,636

[22] Filed: Feb. 18, 1993

[30] Foreign Application Priority Data

Feb. 29, 1992 [EP] European Pat. Off. ........ 92200592.1

[51] Int. Cl.$^5$ ................................. G03C 3/00
[52] U.S. Cl. ................................. 430/253; 430/200; 430/252; 430/256; 430/257; 430/259; 430/262; 430/263; 430/254; 430/270; 430/945; 430/964
[58] Field of Search ............... 430/253, 252, 256, 257, 430/259, 262, 263, 200, 254, 964, 270, 328, 945

[56] References Cited

U.S. PATENT DOCUMENTS

| | | | |
|---|---|---|---|
| 4,985,346 | 1/1991 | Suzuki | 430/254 |
| 5,064,744 | 11/1991 | Fukui et al. | 430/253 |
| 5,104,767 | 4/1992 | Nakamura | 430/254 |

FOREIGN PATENT DOCUMENTS

| | | |
|---|---|---|
| 58-18290 | 2/1983 | Japan . |
| 2213950 | 8/1989 | United Kingdom . |

Primary Examiner—Charles L. Bowers, Jr.
Assistant Examiner—Geraldine Letscher
Attorney, Agent, or Firm—Breiner & Breiner

[57] ABSTRACT

The present invention provides a heat recording material comprising on a support in the order given a porous layer of an image forming substance, a substance capable of converting radiation into heat, a thermoplastic layer containing a photocurable composition and a stripping layer. The present invention further provides a method for obtaining an image with such an heat recording material. Images of high quality and good wear and scratch resistance are obtained.

11 Claims, 1 Drawing Sheet

HEAT-SENSITIVE RECORDING MATERIAL AND METHOD FOR OBTAINING AN IMAGE USING THE SAME

FIELD OF THE INVENTION

The present invention relates to a method for obtaining images using an imaging element that can be developed using only dry development steps and to an imaging element for use in such a method. More particularly it relates to a heat mode recording material.

BACKGROUND OF THE INVENTION

In the past several proposal have been made for obtaining an imaging element that can be developed using only dry development steps (hereinafter called dry imaging element) without the need of processing liquids as for example in silver halide photographic materials. Two major classes of dry imaging elements can be distinguished by the method used for exposing them.

According to one class an image is formed in a photosensitive layer using exposure to actinic radiation. Generally the photosensitive layer comprises a photopolymerizable composition. The use of photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc. The thus produced differences may be subsequently employed in a developing step to produce a visible image and/or master for printing e.g. a lithographic or electrostatic printing master.

The use of the difference in tackiness to obtain an image is described in e.g. U.S. Pat. Nos. 3,060,024, 3,085,488 and 3,649,268. According to the method disclosed in these U.S. patents the image-wise exposed photopolymerizable composition looses its tackiness in the exposed parts while the non-exposed parts keep their tackiness. The non-exposed parts can therefore be colored with dry dye pigments to make the image visible.

According to the methods described in e.g. U.S. Pat. No. 3,245,796 and EP-A 362,827 the diffusibility of a dye is impeded in the photo-exposed parts of the photopolymerizable composition so that during an overall thermal heating subsequent to photo-exposure dye substances in the non-exposed areas will be able to diffuse to a receptor material. According to a similar method described in U.S. Pat. No. 4,587,198 the photopolymerizable composition is made impermeable in the exposed parts for a sublimable dye or dye-pigment present in a layer contiguous to the layer comprising the photopolymerizable composition.

According to a method disclosed in U.S. Pat. No. 3,060,023 the adhesion of the photopolymerizable composition is modified upon image-wise exposure. After image-wise exposure the non-exposed parts will stick or adhere, during a step of overall heating, to a receiving sheet thus allowing the transfer of the non-exposed parts to the receiving sheet.

On the other hand dry imaging elements are known that can be image-wise exposed using an image-wise distribution of heat. These types of dry imaging elements also called heat recording materials offer the advantage in addition to an ecological advantage that they do not need to be handled in a dark room nor any other protection from ambient light is needed. A disadvantage of heat mode recording materials is their low sensitivity requiring powerful exposure means. This disadvantage is probably one of the major reasons why heat mode recording materials have not found wide acceptance up till recently despite their potential advantages. Since powerful exposure means especially lasers are becoming more readily available it may be expected that said disadvantage will no longer impair the wide spreading of heat mode recording materials.

Heat mode recording materials are disclosed in e.g. U.S. Pat. Nos. 4.123.309, 4.123.578, 4.157.412, 4.547.456 and PCT application WO 88/04237. The latter application discloses a web having an image forming surface and a porous layer of an image forming substance. The element further comprises a heat sensitive substance. Upon imaging with a laser the image forming surface is liquefied at the exposed parts thereby penetrating the porous layer and improving its adherence to the web while at the non-exposed parts liquefying of the image forming surface does not take place and as a consequence the adherence of the porous layer to the web remains poor. The porous layer can then be removed in the non-exposed areas using a stripping tape or by simply rubbing. Since the thus obtained image may be easily scratched and is very poor wear resistant it is necessary to laminate a protecting layer to the image which is inconvenient and makes such a heat recording material less attractive.

Furthermore due to the subtle balance of adhesion forces between the porous layer and the image forming surface and the cohesive forces within the porous layer the removal of the porous layer with a stripping tape has to be performed under very stringent conditions and even then lateral cracks of the porous layer in the exposed parts may occur resulting in a decreased image density.

SUMMARY OF THE INVENTION

It is an object of the present invention to provide a heat mode recording material capable of yielding images of high contrast, high density and sharpness and that are wear resistant and are not easily scratched.

It is a further object of the present invention to provide a method for obtaining an image with a heat mode recording material having the above mentioned properties.

It is another object of the present invention to provide a method for obtaining an image with a heat mode recording material having the above mentioned properties using a digitally controlled source of heat.

Further objects of the present invention will become clear from the description hereinafter.

According to the present invention there is provided a heat recording material comprising on a support a porous layer of an image forming substance, a substance capable of converting radiation into heat, a thermoplastic layer containing a photocurable composition and a stripping layer.

According to the present invention there is provided a method for obtaining an image with a heat recording material comprising on a support a porous layer of an image forming substance, a substance capable of converting radiation into heat, a thermoplastic layer containing a photocurable composition and a stripping layer comprising the steps of:

- image-wise exposing said heat recording material to intense radiation through said support;
- allowing said porous layer to adhere to said support at the exposed parts;
- overall exposing said photocurable composition through said stripping layer so as to cure said photocurable composition and
- peeling off said stripping layer from said heat recording material so that an image of said porous layer remains on said support.

DETAILED DESCRIPTION OF THE INVENTION

The working of the present invention will be described using the FIGS. 1 and 3. The description of the working of the invention using these figures is only intended for a clear understanding of the invention without however limiting it thereto.

BRIEF DESCRIPTION OF THE FIGURES

Referring now to FIG. 1. FIG. 1 represents a cross-sectional view of an heat recording material according to the invention comprising on a support 10 a porous layer 20 containing an image forming substance 21, a photocurable composition 30 and a stripping layer 40, The heat recording material further comprises a substance capable of converting radiation into heat in at least the porous layer or thermoplastic layer or the image forming substance itself may be capable of converting radiation into heat in which case an additional substance for converting radiation to heat is optional. The heat recording material of FIG. 1 is exposed to an image wise distribution of heat represented by 50 through the support 10. The solid black part of 50 represents the image values to be reproduced while the open part of 50 represents the non-image values so that the parts of the heat recording material exposed correspond to the image values. As a result of the image-wise exposure to heat via the intense radiation an increased adherence between support 10 and layer 20 results in the exposed parts probably because the interface between support 10 and layer 20 will soften during said image-wise heat exposure. During image-wise heating the thermoplastic layer 30 will also soften or melt and therein penetrating the porous layer 20 probably as a consequence of capillary forces. Subsequent or simultaneously with this image-wise exposure the heat recording material is overall exposed through stripping layer 40 and optionally also through the support of the heat recording material to radiation suitable for curing layer 30. The penetration of layer 30 into layer 20 may be partially or complete but is in any case sufficient to make the adherence at these parts of layer 30 to layer 20 after the overall exposure larger then to stripping layer 40.

Figure 1:
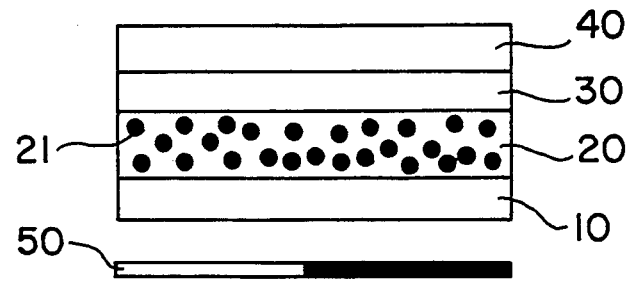
FIG. 1 is a cross-sectional view of an embodiment of a heat recording material in its simplest form according to the invention.
Figure 2:
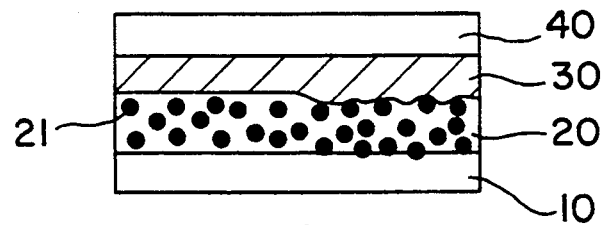
FIG. 2 is a cross-sectional view of the heat recording material of FIG. 1 after image-wise exposure to intense radiation and overall exposure of the photocurable composition.
Figure 3:
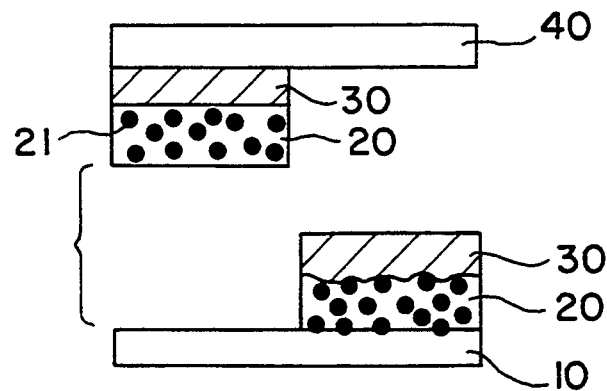
FIG. 3 is a cross-sectional view of the two elements obtained after peel off of the stripping layer.

The result of the image-wise exposure to heat and overall exposure of the heat recording material is represented by the cross-sectional view of FIG. 2 wherein the arcing of layer 30 represents that said layer is cured. The stripping layer of the thus obtained heat recording material is subsequently peeled off therein removing layers 20 and 30 in the parts not exposed or insufficiently exposed by the image-wise distribution of heat.

As a result two complementary images are obtained.

It is now an advantage of the present invention that the image remaining on the support 10 is covered by the cured layer 30 so that the image is very wear and scratch resistant. The scratch resistance and wear resistance may then be further improved by overall exposure of the image to heat and/or actinic radiation.

Image-wise exposure according to the invention is preferably carried out using a laser having a sufficient energy output for softening the interface between the support of the heat recording material and the porous layer and simultaneously to cause penetration of the thermoplastic layer 30 into the porous layer. Especially preferred lasers are semiconductor diode lasers and YAG-lasers e.g. Nd-YAG lasers. The laser may have a power output between 40 and 7500 mW and preferably operates in the infrared part of the spectrum.

Overall exposure of the photocurable composition contained in thermoplastic layer of the heat recording material according to the invention is preferably carried out using UV-radiation or the short wavelength part of the visible region of the spectrum i.e. between 400 nm and 500 nm. Other radiation may also be used in accordance with the present invention provided that the photocurable composition is appropriately sensitized for the wavelength of the radiation used. Suitable light sources for the overall exposure in accordance with the invention are e.g. high or medium pressure halogen mercury vapour lamps, e.g. of 1000 W, Xenon lamps etc. The overall exposure is preferably carried out after the image-wise exposure to heat.

Supports of the heat recording material according to the present invention should be transparent to the radiation used for image-wise exposing the heat recording material to heat. Preferably used supports in connection with the present invention are e.g. polyester film e.g. polyethylene terephthalate, polyethylene, polypropylene, copolymers of styrene and acrylonitrile, polyvinyl chloride, polycarbonate and polyvinylidene chloride. The transparent support may also be colored provided the support remains transparent to the radiation used for image-wise exposure. For example a blue colored polyester film support can be used in accordance with the present invention. The thickness of said support may be varied widely but is preferably between 10 $\mu$m and 300 $\mu$m most preferably between 50 $\mu$m and 200 $\mu$m.

The image forming substances used in accordance with the present invention are preferably pigments. Suitable pigments for use in accordance with the invention are e.g. $TiO_2$, $SiO_2$, colloidal carbon, phthalocynaine pigments and other dye pigments, graphite, phosphor particles, ceramics, clays, metal powder such as aluminium, copper, magnetic iron and bronze, etc. or mixtures thereof. A preferred pigment used is colloidal carbon since it is capable of converting e.g. infrared radiation into heat. Thus in the latter case the image forming substance and substance capable of converting the radiation used for image-wise exposure into heat are the same. Preferably the porous layer according to the invention also contains SiO₂ particles to strengthen said layer.

When the image forming substance itself is not capable of converting the radiation into heat an additional substance capable of converting radiation to heat is required. Said substance is preferably present in the porous layer but may also be present at least partially in a neighbouring layer e.g. in the support, a layer between the support and the porous layer or the thermoplastic layer. Since infrared radiation is preferably used for image-wise exposing the heat recording material according to the present invention the substance capable of converting radiation to heat are preferably infrared absorbing substances such as e.g. infrared dyes, infrared pigments, carbon black etc.. Suitable infrared dyes are disclosed in e.g. U.S. Pat. No. 4833124, EP-321923, U.S. Pat. Nos. 4772583, 4942141, 4948776, 4948777, 4948778, 4950639, 4950640, 4912083, 4952552, 5024990, 5023229 etc. Suitable infrared absorbing pigments are e.g. HEUCODOR metal oxide pigments available from Heubach Langelsheim.

The thermoplastic layer of the heat recording material according to the present invention contains a photocurable composition. Preferably used photocurable compositions are photopolymerizable compositions. The photopolymerizable composition preferably contains urethane type monomers as disclosed in EP-A-91200468.6 and DE-A-4129284.7 filed 3.9.91. These type of monomers offer the advantage that they show a rapid polymerization and solidify even at low conversions of less than 10%. Examples of urethane type monomers are:

DEOS no. 4,005,231, 3,516,256, 3,516,257 and 3,632,657, unsaturated esters of polyols, particularly such esters of the alpha-methylene carboxylic acids, e.g. ethylene diacrylate, glycerol tri(meth)acrylate, ethylene dimethacrylate, 1,3-propanediol di(meth)acrylate 1,2,4-butanetriol tri(meth)acrylate, 1,4-cyclohexanediol di(meth)acrylate, 1,4-benzenediol di(meth)acrylate, pentaerythritol tetra(meth)acrylate, 1,5-pentanediol di(meth)acrylate, the bis acrylates and methacrylates of polyethylene glycols of molecular weight 200–500, and the like: unsaturated amides, particularly those of the alphamethylene carboxylic acids, and especially those of alpha-omega-diamines and oxygen-interrupted omega-diamines, such as methylene bis-acrylamide, methylene bis-methacrylamide, 1,6-hexamethylene bis-acrylamide, diethylene triamine tris-methacrylamide, bis(gamma-methacryl amidopropoxy)ethane, beta-methacrylamidoethyl methacrylate N-(beta-hydroxyethyl)-beta-(methacrylamido)ethyl acrylate and N,N-bis(beta-methacrylolyoxyethyl)acrylamide; vinyl esters e.g. divinyl succinate, divinyl adipate, divinyl phthalate, divinyl butane-1,4-disulfonate; and unsaturated aldehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc.. It will be clear that these monomers and/or polymers and/or oligomers can be used in admixture.

The photopolymerizable composition preferably also comprises at least one photoinitiator. Preferably used photoinitiators are polymerization initiators activatable

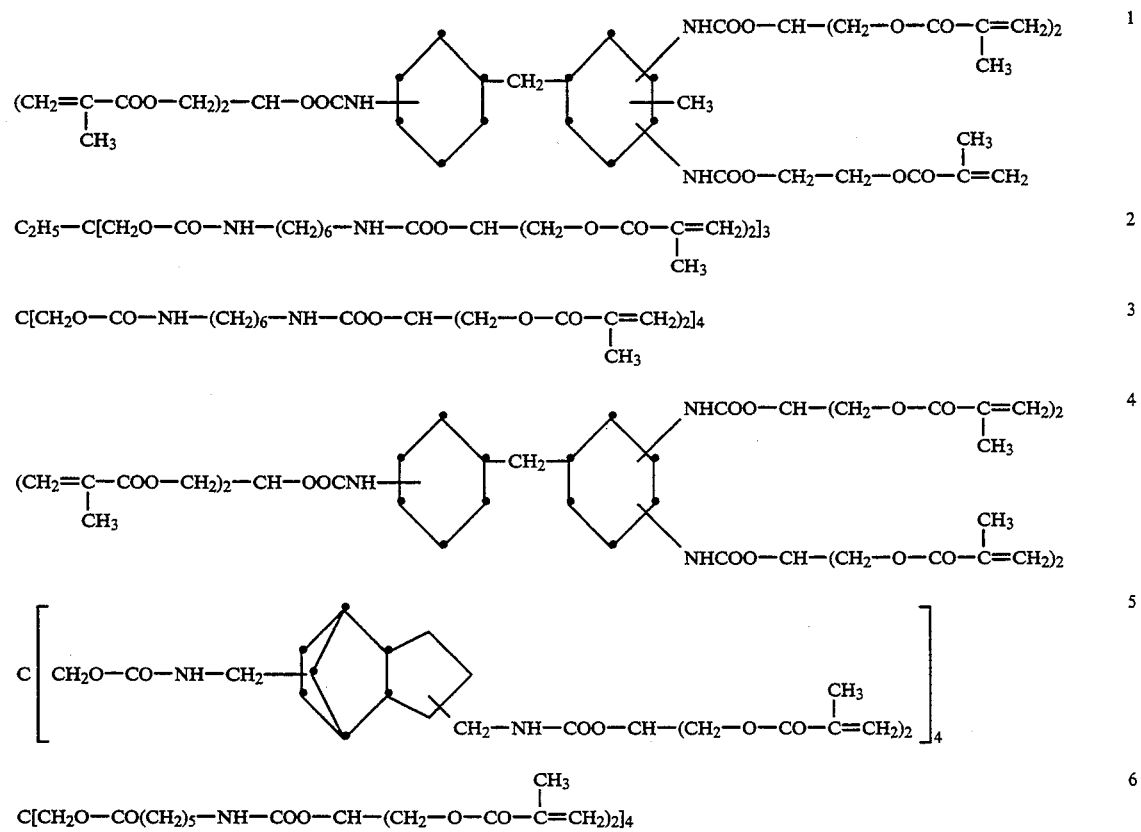

Other types of monomers suitable for use in the photopolymerizable composition used in accordance with the present invention are e.g. the monomers disclosed in by actinic light and thermally inactive at and below 185° C. Examples of such initiators include the substituted or unsubstituted polynuclear quinones which are compounds having two intracyclic carbonyl groups attached to intracyclic carbon atoms in a conjugated six-membered carbocyclic ring, there being at least one aromatic carbocyclic ring fused to the ring containing the carbonyl groups. Such initiators include 9-10-anthraquinone, 1-chloroanthraquinone, 2-chloroanthraquinone, 2-methylanthraquinone, 2-tert-butylanthraquinone, octamethylanthraquinone, 1,4-naphtoquinone, 9,10-phenanthrenequinone, 1-2benzanthraquinone, 2,3-dichloronaphthoquinone, sodium salt of anthraquinone alpha-sulfonic acid, 3-chloro-2-methylanthraquinone, and 1,2,3,4-tetrahydrobenzene a anthracene-7,12-dione. The photointiators which are also useful are described in Plambeck U.S. Pat. No. 2,760,863 and include vicinal ketaldonyl compounds, such as diacetyl, benzil, etc. alpha-ketaldonyl alcohols, such as benzoin, pivalon, etc. acyloin ethers e.g. benzoin methyl and ethyl ethers, etc.; alpha-hydrocarbon substituted aromatic acyloins, including methylbenzoin, alpha-allylbenzoin, and alpha-phenylbenzoin. Still further photoinitiators useful in accordance with the present invention are those disclosed in "Photoreactive Polymers" by Arnost Reiser, "Organic photochemical imaging systems" by G. A. Delzenne, in the paper "UV-Curing Chemistry: Past, Present, and Future" by Christian Decker, published in J. of Coatings Technology, Vol. 59, N° 751, August 1987, pages 97–106, in EP-A 362,827, and in U.S. Pat. No. 3,558,309.

The weight ratio of photoinitiator to the polymerizable compound(s) in the photopolymerizable composition is preferably between 1:1 and 1:10.

According to an alternative embodiment of the present invention the photopolymerizable composition may comprise one or more monomers that can be cationically polymerized. For example the photopolymerizable composition may comprise an epoxy monomer and a cationic photoinitiator. Cationic photopolymerization offers the advantage over radical polymerization that the former is not susceptible to inhibition by oxygen. Suitable cationic photopolymerizable compositions that can be used in carrying out the method of the present invention can be chosen from the many existing organic photoreactive compositions such as those described in "Photoreactive Polymers" by Arnost Reiser, John Wiley & Sons, New York., in a paper entitled "UV curing of epoxides by cationic polymerization" published by William R. Watt in Radiation Curing (November 1986) p. 7–25, in the offprint entitled "Organic photochemical imaging systems" by G. A. Delzenne from Advances in Photochemistry, Volume 11, Edited by John Wiley in 1979, in "Light-sensitive Systems" by Jaromir Kosar, edited in 1965 by John Wiley & Sons, New York., and in the literature referred to in theses documents.

According to the present invention thermal polymerization inhibitors may also be added to the photopolymerizable composition. Inhibitors for use in accordance with the present invention are p-methoxyphenol, hydroquinone, alkyl and acyl-substituted hydroquinones and quinones, tert-butyl catechol, pyrogallol, copper resinate, naphtylamines, beta-naphthol, cuprous chloride, 2,6-di-tert-butyl p-cresol, photothiazine, pyridine, nitrobenzene and dinitrobenzene, p-toluquinone and chloranil.

According to a preferred mode of the present invention the thermoplastic layer comprises a thermoplastic polymer. The thermoplastic layer is preferably solid at temperatures below 40° C. and softens or melts at temperatures between 40° C. and 250° C.

Suitable thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Poly(meth)acrylate and alpha-alkyl poly(meth)acrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alcohol;

(M) Polyvinyl acetal, e.g. polyvinyl butyral, polyvinyl formal;

(N) Polyformaldehydes;

(O) Polyurethanes and copolymers;

(P) Polycarbonate and copolymers;

(Q) Polystyrenes and copolymers e.g. polystyrene/acrylonitrile, polystyrene/acrylonitrile/butadiene.

To the thermoplastic polymer constituent of the thermoplastic layer there can be added non-thermoplastic polymeric compounds to give certain desirable characteristics, e.g. to adjust the adhesion to the stripping layer or other neighbouring layers used in accordance with the present invention, wear properties, chemical inertness, etc. Suitable non-thermoplastic polymeric compounds include polyvinyl alcohol, polyvinyl pyrrolidone, cellulose, anhydrous gelatin, phenolic resins and melamine-formaldehyde resins, etc. If desired, the thermoplastic layer can also contain immiscible polymeric or non-polymeric organic or inorganic fillers or reinforcing agents which are essentially transparent at the wave-lengths used for the exposure of the photopolymeric material, e.g. the organophilic silicas, bentonites, silica, powdered glass, colloidal carbon, as well as various types of dyes and pigments in amounts varying with the desired properties of the thermoplastic layer. The fillers are useful in improving the strength of the composition, reducing tack and in addition, as coloring agents.

Agents to improve the wetting and/or adjust the adhesion of the thermoplastic layer may be added. Suitable agents are e.g. silicones, silicon containing polymers e.g. a poly(dimethylsiloxane)-polyether copolymer, poly(dimethylsiloxane)-polyester, silicon containing surfactants, fluor containing copolymers and fluor containing surfactants etc.

Various dyes, thermographic compounds, UV-absorbers, anti-oxidants and color forming components can be added to the photopolymerizable composition to give a variety of results after the thermal transfer. These additive materials, however, preferably should not absorb excessive amounts of light at the exposure wavelength or inhibit the polymerization reaction.

The stripping layer suitable for use in accordance with the present invention should be transparent to the radiation used for curing the photocurable composition contained in the thermoplastic layer. Examples of stripping layers that can be used in connection with the present invention are e.g. polyester film, polystyrene film, polypropylene film, polyethylene film, polycarbonate, polyvinylchloride, copolymers of styrene and acrylonitrile etc. Preference is given to polyethylene terephthalate film as a stripping layer. The thickness of the stripping layer may be varied widely but is preferably between 3 $\mu$m and 60 $\mu$m. The stripping layer may be provided with one or more prime coatings to adjust the adhesion of the stripping layer to the neighbouring layers.

According to the present invention the heat recording material may contain additional layers. For example it is advantageous to include a subbing layer between the support and the thermoplastic layer containing the photocurable composition. Said subbing layer preferably comprises a polymer containing polymerizable ethylenically unsaturated groups. Examples of polymers containing polymerizable ethylenically unsaturated groups for use in said base layer are polymers comprising vinyl groups, allyl groups, (meth)acrylate groups, butadiene groups, isoprene groups etc., e.g. acrylated epoxies, polyester acrylates, urethane acrylates etc. Further additives may be added to said subbing layer as disclosed in EP-A-91201824.9. It is however important with respect to the present invention that the subbing layer is sufficiently transparent to the radiation used for exposure of the photocurable composition contained in the thermoplastic layer.

It is furthermore preferred to include a barrier layer between the porous layer and the thermoplastic layer. According to the present invention the barrier layer should be impermeable at ambient temperature to avoid penetration of the photopolymerizable composition from the thermoplastic layer into the porous layer while the barrier layer should be permeable at the temperature generated in the heat recording material during image-wise exposure to heat. By the term 'permeable' is to be understood that the photopolymerizable composition and optionally other constituents of the thermoplastic layer can diffuse through the barrier layer or that the photopolymerizable composition together with the barrier layer penetrates into the porous layer.

Preferably used barrier layers in accordance with the present invention are layers comprising a hydrophilic polymer having a softening or melting temperature above ambient temperature but below the temperature generated during image-wise exposure of the heat recording material to heat. Preferably used hydrophilic polymers in connection with the present invention are gelatin, polyvinyl pyrrolidone or polyvinylalcohol. Preferably the thickness of the barrier layer is between 0.05 g/m$^2$ and 0.8 g/m$^2$ and more preferably between 0.1 g/m$^2$ and 0.4 g/m$^2$.

The present invention will now be illustrated by the following examples without however limiting it thereto. All parts are by weight unless otherwise specified.

EXAMPLE 1

A stripping layer of polyester film having a thickness of 5 $\mu$m was applied in the order given the following 3 layers using gravure printing:

1) a prime coating layer containing a copolyester of isophthalic acid (40 mol % of the total amount of acid), terephthalic acid (53 mol % of the total amount of acid), sulphoisophthalic acid sodium salt (7 mol % of the total amount of acid) and ethylene glycol at a dry thickness of 0.13 g/m$^2$ 2) a subbing layer containing polyvinyl alcohol of which 25 mol % of the hydroxyl groups were modified with methacryloyl chloride to a dry layer thickness of 1 g/m$^2$ 3) a photosensitive layer having a total layer thickness of 4.1 g/m$^2$ and containing compound 2 mentioned above in an amount of 2.38 g/m$^2$, benzimidazol in an amount of 1.64 g/m$^2$, mercapto benzoxazole in an amount of 0.096 g/m$^2$, Michlers ketone in an amount of 0.048 g/m$^2$ and a blue dye (C.I. 61551) in an amount of 0.14 g/m$^2$.

To a polyester film support having a thickness of 100 $\mu$m were simultaneously coated using slide hopper coating in the order given an aqueous dispersion containing 4% of carbon black, 0.8 % of polyvinyl pyrrolidone and 0.6% of a wetting agent at a dry layer thickness of 1 g/m$^2$ and an aqueous solution containing 1.5% of gelatin a dry layer thickness of 0.2 g/m$^2$.

Both elements were subsequently laminated to each other in a LPP 650 laminator (commercially available from DORNED) at a temperature of 70° C. a rate of 0.6 m/min.

4 thus prepared heat recording materials were image-wise exposed through the polyethylene terephthalate film support using a Nd-YAG laser having an output of 160 mWatt and 3 of the heat recording materials were subsequently overall exposed through the stripping layer of polyethylene terephthalate film and through the support of the heat recording material using a Dupliphot apparatus (commercially available from Agfa-Gevaert N.V.) with an output of respectively 50,800 and 900 illumination units. Subsequent thereto the stripping layer of each of the heat recording materials was peeled off and an image of high density, sharpness, good contrast and excellent wear resistance was obtained with each of the 3 heat recording materials that were overall exposed. The fourth heat recording material not overall exposed in the Dupliphot apparatus yielded an image of low quality and low wear resistance and could be easily scratched.

EXAMPLE 2

2 heat recording materials prepared and image-wise exposed as in example 1 were overall exposed in a Dupliphot apparatus respectively through the stripping layer and through the support of the heat recording material. After peeling off the stripping layer an image of good quality and high wear resistance was obtained with the heat recording material exposed through the stripping layer while the other heat recording material yielded an image of poor quality and low wear resistance.

What we claim is:

1. A heat-sensitive recording material comprising on a support in the order given a porous layer of an image forming substance, a thermoplastic layer containing a photocurable composition and a stripping layer, said heat-sensitive material further comprising in said porous layer or a neighboring layer thereto or in said thermoplastic layer a substance capable of converting radiation into heat and/or said image forming substance is capable of converting radiation into heat.

2. A heat-sensitive recording material according to claim 1 wherein said image forming substance contains carbon black.

3. A heat-sensitive recording material according to claim 1 wherein said photocurable composition is a photopolymerizable composition comprising monomers having at least 2 polymerizable groups.

4. A heat-sensitive recording material according to claim 1 wherein said heat recording material further comprises a barrier layer between said porous layer and said thermoplastic layer.

5. A heat-sensitive recording material according to claim 4 wherein said barrier layer comprises gelatin, polyvinyl pyrrolidone or polyvinyl alcohol.

6. A heat-sensitive recording material according to claim 1 wherein said stripping layer is a polyester film.

7. A method for obtaining an image using a heat-sensitive recording material comprising on a support a porous layer of an image forming substance, a thermoplastic layer containing a photocurable composition and a stripping layer, said heat-sensitive material further comprising in said porous layer or a neighboring layer thereto or in said thermoplastic layer a substance capable of converting radiation into heat and/or said image forming substance is capable of converting radiation into heat, comprising the steps of:

image-wise exposing said heat-sensitive recording material to intense radiation through said support;

allowing said porous layer to adhere to said support at the exposed parts;

overall exposing said photocurable composition through said stripping layer so as to cure said photocurable composition and peeling off said stripping layer form said heat-sensitive recording material so that an image of said porous layer remains on said support.

8. A method according to claim 7 wherein said photocurable composition is a photopolymerizable composition comprising monomers having at least 2 polymerizable groups.

9. A method according to claim 7 wherein said heat-sensitive recording material further comprises a barrier layer between said porous layer and said thermoplastic layer.

10. A method according to claim 9 wherein said barrier layer comprises gelatin, polyvinyl pyrrolidone or polyvinyl alcohol.

11. A method according to claim 7 wherein said stripping layer is a polyester film.

* * * * *